United States Patent [19]

Ito

[11] Patent Number: 5,424,856
[45] Date of Patent: Jun. 13, 1995

[54] COLOR IMAGE READING APPARATUS

[75] Inventor: Hisao Ito, Kanagawa, Japan

[73] Assignee: Fuji Xerox Co., Ltd., Tokyo, Japan

[21] Appl. No.: 886,881

[22] Filed: May 22, 1992

[30] Foreign Application Priority Data

Jun. 14, 1991 [JP] Japan ................... 3-169124

[51] Int. Cl.⁶ ............... H01L 27/14; H04N 1/028
[52] U.S. Cl. .................... 358/483; 358/482; 250/227.28
[58] Field of Search ............... 358/500, 501, 505, 513, 358/514, 400, 401, 471, 474, 482, 483, 296, 902; 250/227.26, 227.28

[56] References Cited

U.S. PATENT DOCUMENTS 4,479,149 10/1984 Yoshioka et al. .
4,654,536 3/1987 Saito et al. .
4,763,189 8/1988 Komatsu et al. .
5,119,183 6/1992 Weisfield et al. .

FOREIGN PATENT DOCUMENTS 63-9358 1/1988 Japan .

OTHER PUBLICATIONS

"High-Performance a-Si:H Thin Film Transistor Driven Linear Image Sensor with New Multiplex Structure for G4 Facsimile," by H. Miyake et al., Japanese Journal of Applied Physics, Vol. 29, No. 12, Dec. 1990, pp. L2373-L2376.

Primary Examiner—Bentsu Ro
Attorney, Agent, or Firm—Finnegan, Henderson, Farabow, Garrett & Dunner

[57] ABSTRACT

A color image reading apparatus reduces the required capacity of line memory for regenerating image signals by making the reading points of the respective photosensor arrays closer to one another. The color image reading apparatus includes a plurality of TFT driven photosensor arrays arranged in rows. The photosensor arrays are disposed immediately adjacent to one another to form a photosensing assemblage, which is flanked by switching elements connected to photosensors. Wiring conductors underlie the outer-positioned arrays to allow electrical contacts to be made to photosensors in the intermediate array and associated switching elements.

4 Claims, 7 Drawing Sheets

COLOR IMAGE READING APPARATUS

FIELD OF THE INVENTION

The present invention relates generally to a color image reading apparatus typically used as an image input device in a facsimile machine, digital copy duplicator, or the like. More particularly, it relates to a color image reading apparatus of a type which is provided with a plurality of photosensor arrays for different colors arranged in rows, and of a type which employs a reading process in which the electric charges generated in a given block of photosensors in each of the arrays are transferred to be read out in the form of electric signals.

BACKGROUND OF THE INVENTION

A typical conventional image sensor used for facsimile machines or the like is a contact type image sensor, which provides electric signals representing a 1:1 image of an original. A TFT (thin film transistor) driven image sensor, which falls under the category of the contact type, has been proposed in the art. In a TFT driven image sensor, the image of the original is segmented into a large number of picture elements (pixels) and falls upon photosensors, each of which corresponds to a particular pixel, to cause electric charges to be induced therein. In response to the energization of switching elements, each of which is composed of a TFT, the induced electric charges in a given block of photosensors are transferred to and temporarily held in associated line capacitances pending output. The stored electric charges therein are sequentially output in the form of electric signals by the action of a driver integrated circuit (IC). A matrix configuration (i.e. a two dimensional addressing scheme) is used to drive the TFTs, which allows a single driver IC to deal with a plurality of blocks of photosensors. For this reason, this type of TFT driven image sensor is requiring fewer driver IC chips for driving the image sensor.

Figure 8:
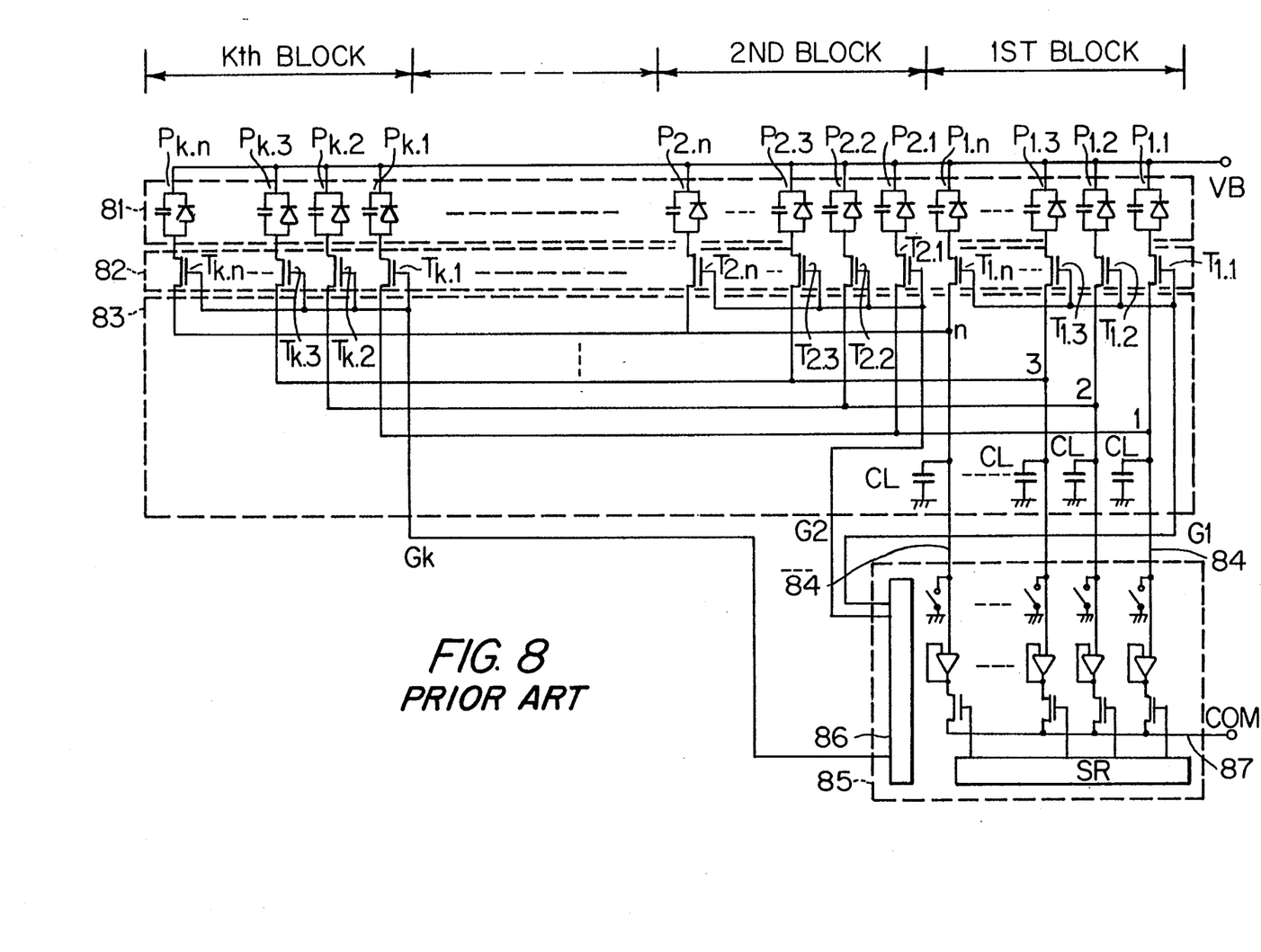
FIG. 8 is an equivalent circuit diagram of the prior art TFT driven image sensor.

Referring to FIG. 8 which illustrates an equivalent circuit diagram of a known TFT driven image sensor of the type mentioned above, it will be observed that the TFT driven image sensor includes a photosensor array 81 having a row of photosensors $P_{i,j}$ for $i=1 \ldots k, j=1 \ldots n$, the length of which is substantially the width of an original. A charge transfer section 82 is also provided, which consists of thin film transistors $T_{i,j}$ for $i=1 \ldots k, j=1 \ldots n$, one for each photosensor. The TFT driven image sensor further includes a matrix configuration multilayered wiring section 83.

The photosensor array 81 is divided into k groups of photosensors, i.e. into k blocks, and each of the blocks consists of n photosensors. Each photosensor $P_{i,j}$ for $i=1 \ldots k, j=1 \ldots n$ may be regarded as equivalent to photodiode and its parasitic capacitance. Each photosensor $P_{i,j}$ for $i=1 \ldots k, j=1 \ldots n$ is connected to the drain electrode of the corresponding TFT $T_{i,j}$ for $i=1 \ldots k, j=1 \ldots n$. The source electrodes of the TFTs in each block are connected to n common signal lines 84 by the matrix configuration multilayered wiring section 83. The source electrode of the first TFT in each block is connected to the first common signal line, the source electrode of the second TFT in each block is connected to the second common signal line, and so forth. The common signal lines 84, in turn, are connected to a driver IC 85. The gate electrodes of the TFTs are connected to a gate pulse generating circuit 86 so that each block can be sequentially operated.

The photoelectric charges generated in each photosensor $P_{i,j}$ for $i=1 \ldots k, j=1 \ldots n$ are temporarily held by the parasitic capacitance of the photosensor and the drain/gate overlap capacitance of the corresponding TFT $T_{i,j}$ for $i=1 \ldots k, j=1 \ldots n$. The photoelectric charges held in a given block are transferred to the multilayered wiring section 83 and held in the line capacitances indicated in the figure by CL in response to the energization of the TFTs in the block which function as switches for transferring the electric charges. All the TFTs in a given block are rendered conductive at a time by simultaneously applying a gate pulse to all gates of the TFTs in the given block, which allows each block to be activated sequentially.

Specifically, TFTs $T_{1,1}$ to $T_{1,n}$ in the first block are turned on in response to a gate pulse $\phi G1$ transmitted on gate signal line G1 from the gate pulse generating circuit 86. The electric charges induced in the photosensors in the first block are transferred to the line capacitances CL and held therein. The electric charges in the line capacitances CL change the potentials of the associated common signal lines 84. Resultant electric voltages are detected in serial order and output onto an output line 87 by sequential turning-on of analog switches $SW_j$ for $j=1 \ldots n$ in the driver IC 85.

Similarly, TFTs $T_{2,1}$ to $T_{2,n}$ through $T_{k,1}$ to $T_{k,n}$ in the second block through the kth block are sequentially turned on in response to respective gate pulses $\phi G2$ to $\phi Gk$. The electric charges induced in the photosensors are transferred and read out block by block, thereby to obtain image signals reflecting a whole line with respect to the fast scan direction of the scanned document. The original to be scanned is then moved by a suitable automatic document feeder (not shown) such as a roller. These operations as mentioned above are repeated, to obtain image signals representing the entire document scanned (Japanese Patent Laid Open No. Sho. 63-9358).

Figure 7:
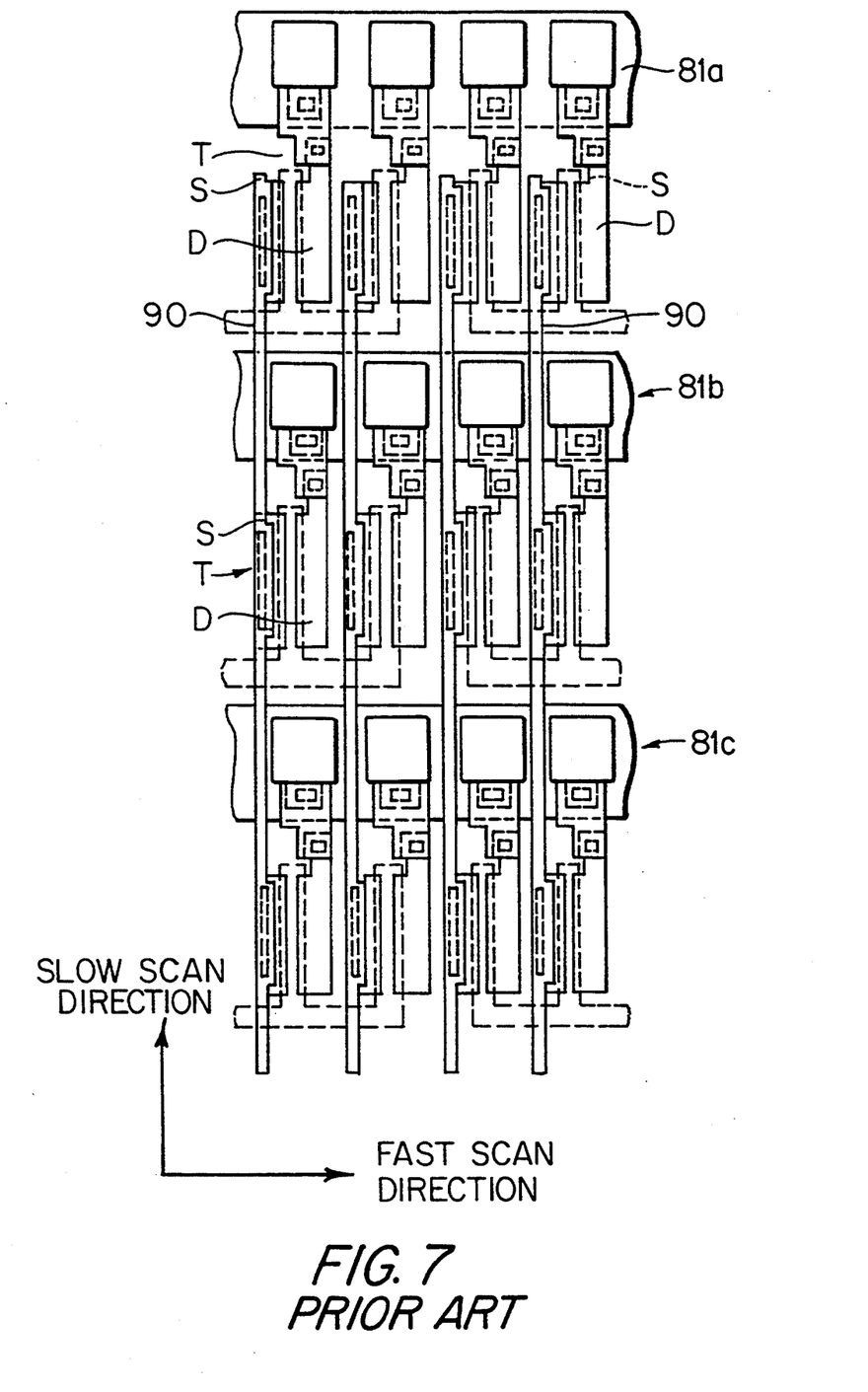
FIG. 7 is a partial plan view illustrative of the prior art color image reading apparatus.

One variation on the aforementioned TFT driven image sensor is a color image reading apparatus using the same basic mechanism, whose structural detail plan view is shown in FIG. 7. It will be seen that the color image reading apparatus has three rows of photosensor arrays 81a, 81b and 81c aligned in the slow scan direction. There is one switching element T for each photosensor of the arrays, and three switching elements T in the column for each pixel have their source electrodes S connected to a signal output line 90. The signal output lines 90 are laid along the slow scan direction between each of the photosensors, so that the photosensor arrays 81a, 81b and 81c can be positioned in parallel to the matrix wiring section 83 shown in FIG. 8. Each row of the photosensor arrays 81a, 81b and 81c is further provided with a linear color transmission filter (not shown) which is transmissive to selected colors, i.e. light of certain wavelengths. Three color transmission filters are employed to distinguish for example the primary colors red, green, and blue, thereby to provide image signals for each color.

This structure of the color image reading apparatus known in the art, however, suffers from various shortcomings and disadvantages. One problem of the prior art is that the color image reading apparatus involves a relatively large capacity of a line memory means incorporated therein. In order to regenerate image signals from color-separated image signals, the color-separated image signals supplied from each of the common signal lines must be temporarily held in the line memory means until the color-separated image signals will complete a set, i.e. one pixel. This problem is caused by the presence of relatively wide spatial gaps in the slow scan direction, which are occupied by the switching elements T intervening between each of the photosensor arrays 81. These spatial gaps consequently cause time delays, as each line of an original is scanned by the photosensor arrays 81 in turn.

Another problem of the prior art is variation in the amount of light incident upon individual photosensors of the arrays 81. In operation, light reflected by a scanned original is concentrated on the photosensor arrays 81 by a lens system (not shown), such as a rod lens array of the type produced by Nippon Sheet Glass Co. Ltd. (Japan) under the name of Selfoc Lens, which is fixed above the color image reading apparatus. As explained above, the three rows of the photosensor arrays are spaced apart in the slow scan direction, resulting in nonuniform light intensities. Even if the intensity of the reflected light is uniform, the amount of light incident upon the photosensor arrays 81 depends on the positions of the arrays.

SUMMARY OF THE INVENTION

In view of the foregoing, an object of the present invention is to provide a construction of a color image reading apparatus in which photosensor arrays are positioned as close to each other as possible.

To achieve the above object, the present invention contemplates a color image reading apparatus which comprises a photosensing assemblage composed of photosensor arrays arranged in rows separated in the slow scan direction. Each photosensor array has a row of blocks aligned in the fast scan direction, and each of the blocks includes a plurality of photosensors juxtaposed in row fashion. Switching elements are also included, connected to the photosensors to transfer electric charges generated in the photosensors block by block. The color image apparatus further comprises a signal output line connected to a plurality of the switching elements in a column which correspond to a particular pixel.

The photosensor arrays are located immediately adjacent to one another, to form a photosensing assemblage, which is flanked by the switching elements. In addition, wiring conductors underlie the outer-positioned photosensor arrays, that is, photosensor arrays intervening between the center photosensor array and each of the rows of the switching elements. The wiring conductors allow electrical contacts to be made to the switching elements and the associated photosensors belonging to the center array of the photosensing assemblage.

According to the present invention, the photosensor arrays responsive to different three colors are located close to one another so that it is possible to reduce the spatial differences in reading points of the respective photosensor arrays.

As for image signals supplied from the center photosensor array of the photosensing assemblage, the image signals are introduced from the photosensors through the wiring conductors underlying the neighboring photosensor arrays onto the signal output lines, and then extracted therefrom.

DETAILED DESCRIPTION OF THE PREFERRED EMBODIMENTS

Figure 1:
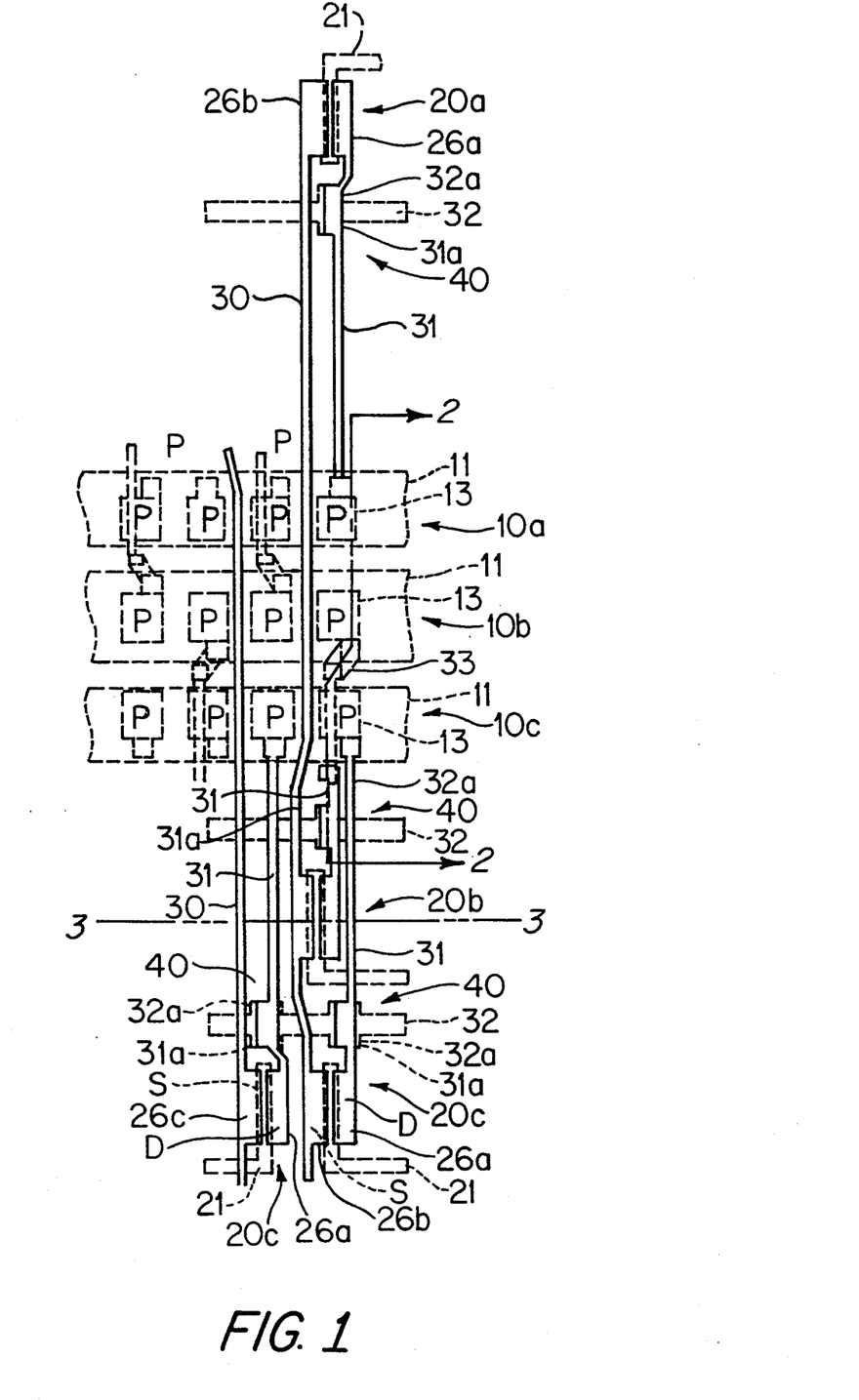
FIG. 1 is a partial plan view illustrative of a first embodiment of a color image reading apparatus in accordance with the present invention.
Figure 2:
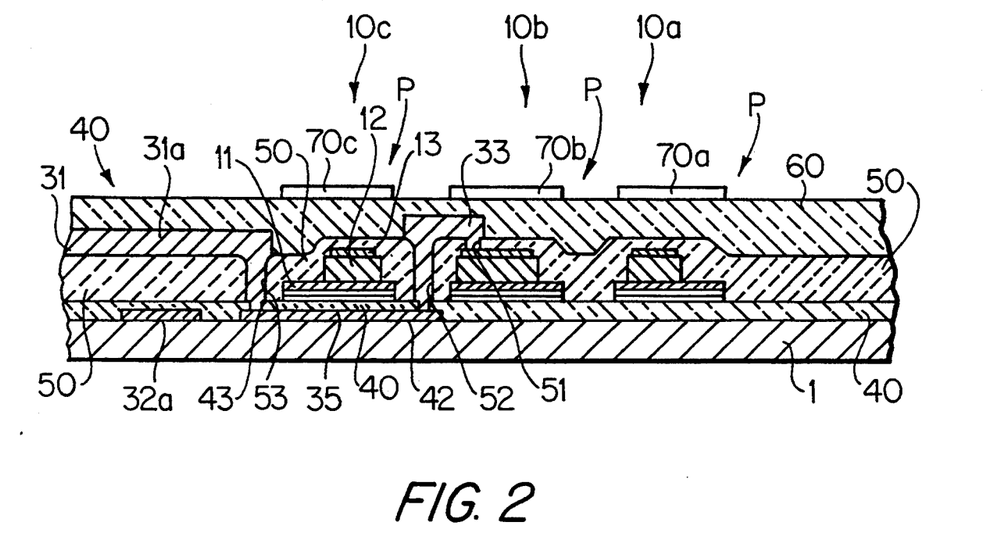
FIG. 2 is a cross-sectional view taken along line 2—2 of FIG. 1.
Figure 3:
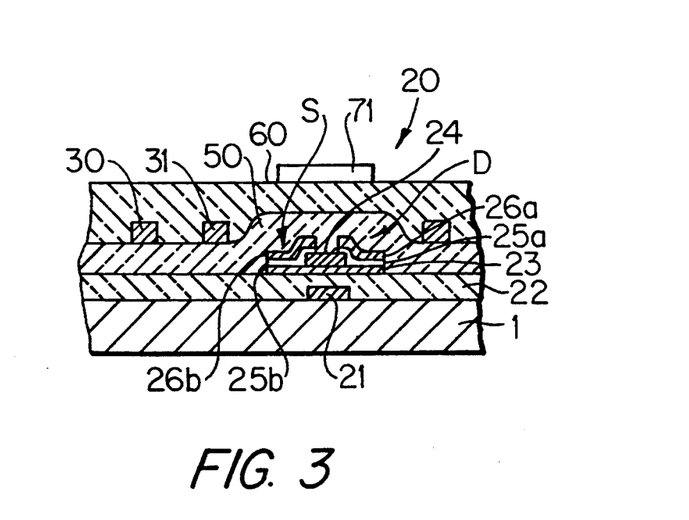
FIG. 3 is a cross-sectional view taken along line 3—3 of FIG. 1.

A first embodiment of a color image reading apparatus in accordance with the present invention will be described with reference to FIGS. 1, 2, and 3. FIG. 2 shows a cross-sectional view taken along line 2—2 of FIG. 1 and FIG. 3 shows a cross-sectional view taken along line 3—3 of FIG. 1.

Photosensor arrays 10a, 10b, and 10c, each of which has a row of photosensors P, are disposed immediately adjacent to and in parallel with one another to form a photosensing assemblage. Each of the photosensors P, which is a constituent element of the photosensor array 10, has a layered or sandwich-type structure, in which a photoelectric conversion layer 12 of amorphous silicon hydride (a-Si:H) is interposed between a spatially continuous linear lower electrode 11 of chromium and an upper electrode 13 discrete by pixel of transparent conductive material such as indium tin oxide. The lower electrode serves as a common electrode for the photosensors P in each row and is supplied with a bias voltage. Located above the photosensor arrays 10a, 10b, and 10c respectively are strip-shaped color transmission filters, 70a, 70b, and 70c of preferably red, green, and blue. An insulating layer 50 and a protecting layer 60 of polyimide intervene between the photosensor arrays and the color transmission filters.

The photosensor P is electrically coupled with a thin film transistor (TFT) 20 which acts as a switching element for transferring electric charges generated in the photosensor P. The TPT 20 is of laminated construction, in which a gate electrode 21 of chromium shared in common within a individual block, a gate insulating layer 22 of silicon nitride (SiNx), a semiconductor active layer 23 of a-Si:H, an upper insulating layer 24 of SiNx, ohmic contact layers 25a and 25b of n+a-Si:H configured separately from each other to constitute a drain electrode D and a source electrode S respectively, and barrier metal layers 26a and 26b of chromium, are superposed in sequence on an insulating substrate 1.

The TFTs 20 are distributed on opposite longitudinal sides of (above and below) the photosensing assemblage. In detail, the TFTs 20a associated with the photosensor array 10a are aligned above the photosensing assemblage, whereas the TFTs 20c associated with the photosensor array 10c are aligned below the photosensing assemblage. The TFTs 20b associated with the center photosensor array 10b are alternately located above and below the photosensing assemblage. The TFTs 20 included in each column have their source electrodes S connected to a signal line 30 which is laid in the slow scan direction between each of the photosensors P. A light shielding filter 71 for preventing light from reaching the semiconductor active layer 23 is formed above the TFTs 20 with interposing insulating layer 50 and protecting layer 60 of polyimide therebetween.

Formed between the photosensor P and the TFT 20 is an additional capacitance means 40 for increasing the capacity on the side of the photosensor P. The additional capacitance means 40 is configured so as to be connected to the upper electrode 13 of the photosensor P, and constructed by forming a quadrilateral 31a at a portion of a wiring conductor 31 connecting to the drain electrode D of the TFT 20, and also forming a lower wiring conductor 32 provided with a quadrilateral 32a which faces the quadrilateral 31a across the insulating layer 50. The additional capacitance means 40 in row arrangement share in common the lower wiring conductor 32 whose electric potential is kept at a constant level such as ground.

The wiring conductors 31 directly connect the photosensors P of the outer-positioned arrays 10a and 10c to the associated additional capacitance means 40. Meanwhile, electrical contact between the photosensor P pertaining to the center array 10b and the associated additional capacitance means 40 is made by a wiring conductor 33 connected to the upper electrode 13 of the photosensor P, a connective wiring conductor 35 of chromium underlying an insulating layer 40 below the neighboring photosensor array, through holes 42 and 43 in the insulating layer 40 and holes 51, 52, and 53 in the insulating layer 50, and the wiring conductor 31 connected to the drain electrode D. The wiring conductors 33 are arranged upward and downward in FIG. 1 for alternate photosensors of the center array 10b.

Next, a fabrication process will be explained for making the color image reading apparatus according to the first embodiment of the present invention. First, a lower chromium layer (Cr1) is deposited on insulating substrate 1 preferably of Corning 7059 to a thickness of 50 nm to 100 nm at a temperature of 150° C. by a sputtering method. The Cr1 layer is then patterned by a photolithography process followed by an etching process in a liquid mixture of cerium nitrate ammonium, perchloric acid, and water, to form gate electrode 21 of TFT, lower wiring conductor 32 of additional capacitance 40, and connective wiring conductor 35. Photolithographically provided resist film is then removed.

After alkali cleaning of the resultant substrate, consecutive depositions are made over the insulating substrate by a P-CVD method. Firstly a lower silicon nitride layer (SiNx1) is deposited to a thickness of 300 nm, secondly a lower amorphous silicon hydride layer (a-Si:H1) to a thickness of 50 nm, and thirdly an upper silicon nitride layer (SiNx2) to a thickness of 150 nm. The SiNx1 layer is deposited under the conditions of a substrate temperature of 300° C. to 400° C., silicon hydride (SiH$_4$) and ammonia (NH$_3$) gas pressures of 0.1 Torr to 0.5 Torr, an silicon hydride gas flow rate of 10 sccm (standard cubic centimeter per minute) to 50 sccm, an ammonia gas flow rate of 100 sccm to 300 sccm, and an RF power of 50 W to 200 W. The a-Si:H1 layer is deposited under the conditions of a substrate temperature of approximate 200° C. to 300° C., an silicon hydride gas pressure of 0.1 Torr to 0.5 Torr, an silicon hydride gas flow rate of 100 sccm to 300 sccm, and an RF power of 50 W to 200 W. The SiNx2 layer is deposited under the conditions of a substrate temperature of approximate 200° C. to 300° C., silicon hydride and ammonia gas pressures of 0.1 Torr to 0.5 Torr, an silicon hydride gas flow rate of 10 sccm to 50 sccm, an ammonia gas flow rate of 100 sccm to 300 sccm, and an RF power of 50 W to 200 W.

The upper surface of the SiNx2 layer is coated with resist film. The rear or back side of the substrate 1 is exposed to light. In this step, the gate electrode 21 itself serves as a mask, so that the SiNx2 layer can be patterned to have the same geometry as the gate electrode 21. The substrate is then subjected to a development process followed by an etching process in a liquid mixture of hydrogen fluoride (HF) and ammonium fluoride (NH$_4$F), to form upper insulating layer 24. Thereafter, the resist film is removed.

The resultant substrate is subjected to a BHF process. An n+type a-Si:H layer for ohmic contact layers 25a and 25b is deposited thereon to a thickness of approximate 100 nm at a temperature of approximate 250° C. by a P-CVD process in a gas mixture of silane (SiH) and phousphorus hydride (PH$_3$). An upper chromium layer (Cr2) is deposited further thereon to a thickness of approximate 150 nm by DC magnetron sputtering. The Cr2 layer contains lower electrode 11 of photosensor P and barrier metal layers 26a and 26b both of which respectively cover ohmic contact layers 25a and 25b of TFT.

An upper amorphous silicon hydride layer (a-Si:H2) for photoelectric conversion layer 12 of photosensor P is deposited thereon to a thickness of approximate 1300 nm, and also an indium tin oxide layer for upper electrode 13 of photosensor P is deposited further thereon to a thickness of approximate 60 nm. Preferably, an alkali cleaning process should precede each of the depositions. The a-Si:H2 layer is deposited by P-CVD under the conditions of a substrate temperature of 170° C. to 250° C., an silicon hydride gas pressure of 0.3 Torr to 0.7 Torr, an silicon hydride gas flow rate of 150 sccm to 300 sccm, and an RF power of 100 W to 200 W. The indium tin oxide layer is deposited by DC magnetron sputtering under the conditions of a substrate temperature of room temperature, argon (Ar) and oxygen (O$_2$) gas pressures of $1.5 \times 10^{-3}$ Torr, an argon gas flow rate of 100 sccm to 150 sccm, an oxygen gas flow rate of 1 sccm to 2 sccm, and a DC power of 200 W to 400 W.

Then, the indium tin oxide layer is patterned by a photolithography process followed by an etching process using dilute hydrochloric acid, to form individual upper electrodes 13 which are segmented and spatially separated from one another so as to realize the individual photosensors P.

With the same resist pattern as applied above, the a-Si:H2 layer is patterned by dry etching in a gas mixture of monochloropentafluoroethane (C$_2$ClF$_5$), sulfur fluoride (SF$_6$), and oxygen (O$_2$), to form individual photoelectric conversion element layers 12 which are, similarly to the upper electrodes mentioned above, segmented and spatially separated from one another so as to realize individual photosensors P. The Cr2 layer for lower electrode 11 acts as a stopper during the dry etching of a-Si:H2 layer, so that the Cr2 layer remains unpatterned. The dry-etched area in the a-Si:H2 layer expands laterally beyond the outer margin of the resist film, resulting in a smaller a-Si:H2 layer than the overlying indium tin oxide layer. For this reason, the indium tin oxide layer is subjected to etching again prior to removal of the resist film, by which the edge of the indium tin oxide layer is etched away from its bottom side. Consequently the indium tin oxide layer become conformable to the a-Si:H2 layer in size.

The substrate is then exposed to light and developed by a photolithography process to yield a resist pattern to define the pattern of the Cr2 layer. Subsequently, the Cr2 layer is patterned by an etching process in a liquid mixture of cerium nitrate ammonium, perchloric acid, and water, to form lower electrodes 11 of photosensors P, and barrier metal layers 26a and 26b of TFT 20. It is followed by removal of the resist film.

Dry etching in a gas mixture of hydrogen fluoride (HF$_4$) and oxygen (O$_2$) is carried out thereafter to etch portions not overlaid by either the Cr2 layer or the SiN×2 layer, which consequently allows the n+type a-Si:H layer and the a-Si:H1 layer to remain under the lower electrode 11 of the photosensors P, and also the n+type a-Si:H layer for ohmic contact layers 25a and 25b and the a-Si:H layer for semiconductor active layer 23 to remain under the barrier metal layers 26a and 26b of TFT 20. That is, the n+type a-Si:H layer and the a-Si:H1 layer are patterned to form semiconductor active layer 23 and to divide ohmic contact layer 25 into two, 25a and 25g, to realize drain electrode D and source electrode S respectively. The SiNx1 is then patterned to form holes 42 and 43 and to obtain gate insulating layer 22 and insulating layer 40.

A polyimide layer 50 is then deposited over the resulting photosensor P and TFT 20, to a thickness of 1500 nm, and subjected to pre-baking at a temperature of approximate 160° C., patterning by a photolithography process and an etching process, and then baking. This patterning is made to form holes 51, 52, and 53 to allow electrical contact to be made to drain electrode D and upper electrode 13 of photosensor P included in the center photosensor array. Then, the substrate is descummed, i.e. the substrate is exposed to plasma in an oxygen environment to completely eliminate remaining materials such as polyimide in and around the holes.

Over the entire resulting substrate, an aluminium layer is deposited to a thickness of 1000 nm at a temperature of approximate 150° C. by a DC magnetron sputtering process, and patterned by a photolithography process in a liquid mixture of hydrofluoric, nitric, and phosphoric acids, and water. Then the resist film is removed. These steps provide a signal output line 30 connecting all the source electrodes S of the TFTs in each pixel, wiring conductor 31 to allow electrical contact to be made to upper electrode 13 and TFT 20, and wiring conductor 33 to allow electrical contact to be made to wiring conductor 35 and upper electrode 13 included in the center photosensor array 10b.

Another polyimide layer is deposited on the resultant substrate to a thickness of approximate 3 μm, pre-baked at a temperature of approximate 125° C., patterned by a photolithography and etching process, and baked at a temperature of approximate 230° C. for 90 minutes to make up protecting layer 60. Then the substrate is descummed to get rid of polyimide left of no use therein.

Finally, strip-shaped color transmission filters 70a, 70b, and 70c of three different colors (red, green, and blue) are respectively formed above the photosensor arrays 10a, 10b, and 10c. And also a light shielding filter 71 is formed above TFT 20.

In the embodiment, a Schottky structure photodiode is employed as photosensor P, which can equally be replaced by a photodiode of the PIN structure. And any other non-crystalline materials such as amorphous silicon carbide (a-SiC) or amorphous silicon-germanium (a-SiGe) than amorphous silicon (a-Si) are acceptable for photoelectric conversion element layer 12 of photosensor P.

Figure 4:
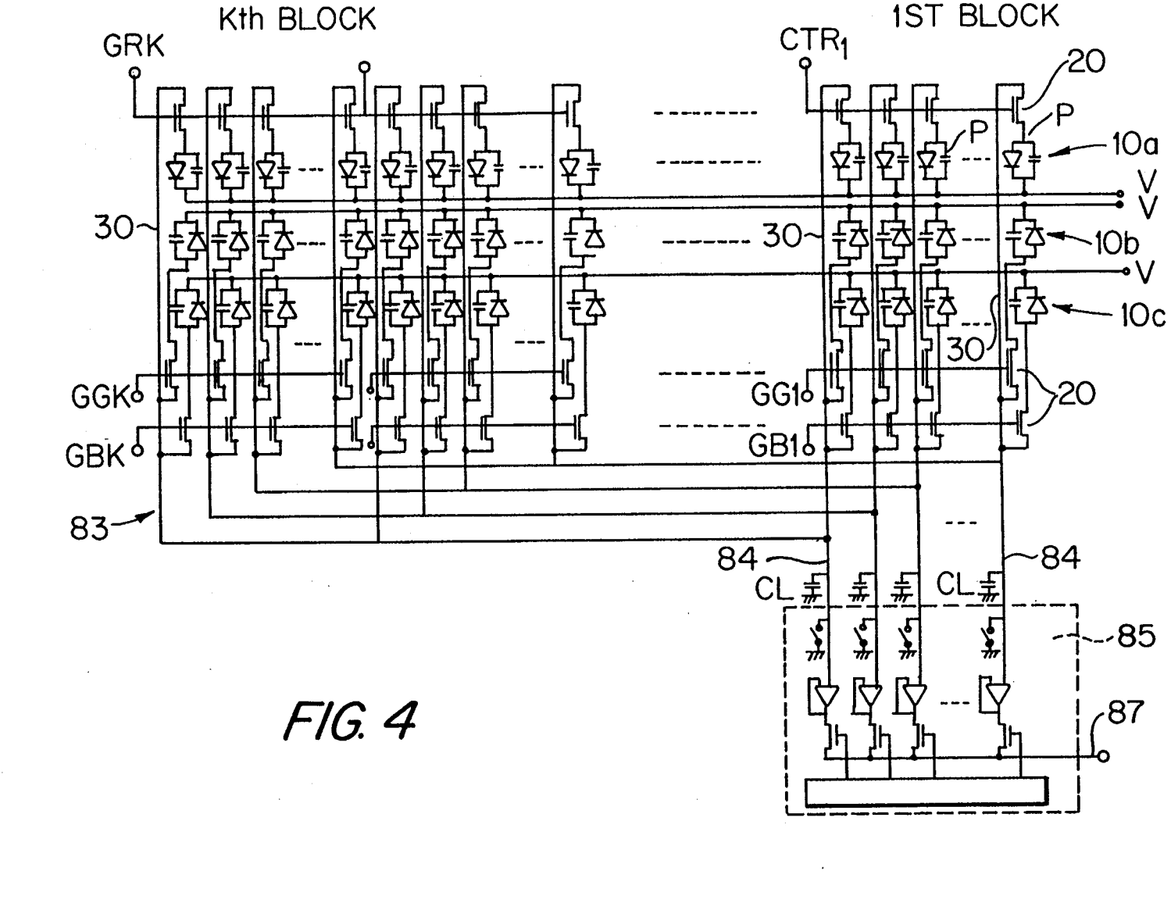
FIG. 4 is an equivalent circuit diagram of the color image reading apparatus shown in FIG. 1.

Next, FIG. 4 shows an equivalent circuit diagram illustrative of the color image reading apparatus mentioned above according to the first embodiment. A switching element T is associated with each photosensor P of each photosensor array. And all source electrodes S of three switching elements T in each column are connected to a signal output line 30, so that three rows of photosensor arrays 10 can be arranged in parallel to the matrix configuration wiring section 83. In response to the energization of TFT 20, the photosensors P in a given block of the photosensor arrays 10 become connected to driver IC 85 through associated signal output lines 84. Therefore, controlling the TFTs 20 allows the three photosensor arrays 10a, 10b, and 10c to scan an original to provide image signals for each color sequentially. The scanning operation of the photosensor array is the same as has been explained as a prior art, and details are not repeated here. The outline of the scanning operation is that electrical charges generated in photosensors P in a given block are transferred to and held in associated line capacitances CL, and then read out from output line 87.

In conformity with the first embodiment set forth above, the photosensor arrays 10a, 10b, and 10c are disposed immediately adjacent to one another so that it is possible to achieve much reduced spatial differences in the reading points of the photosensor arrays 10 for each color. Consequently, the reduced spatial distances in the slow scan direction require a lower capacity of line memory means for producing regenerated image signals from the extracted source image signals.

Additionally, by placing the photosensor arrays 10a, 10b, and 10c more adjacent to one another, the intensity of light incident upon the photosensor arrays does not vary so much depending on the array positions whether outer or center, if a lens system such as Selfoc Lens is employed to concentrate light reflected from an original onto the photosensor arrays. Greater consistency in the incident light allows image signals to be more accurately representative of the source image.

Figure 5:
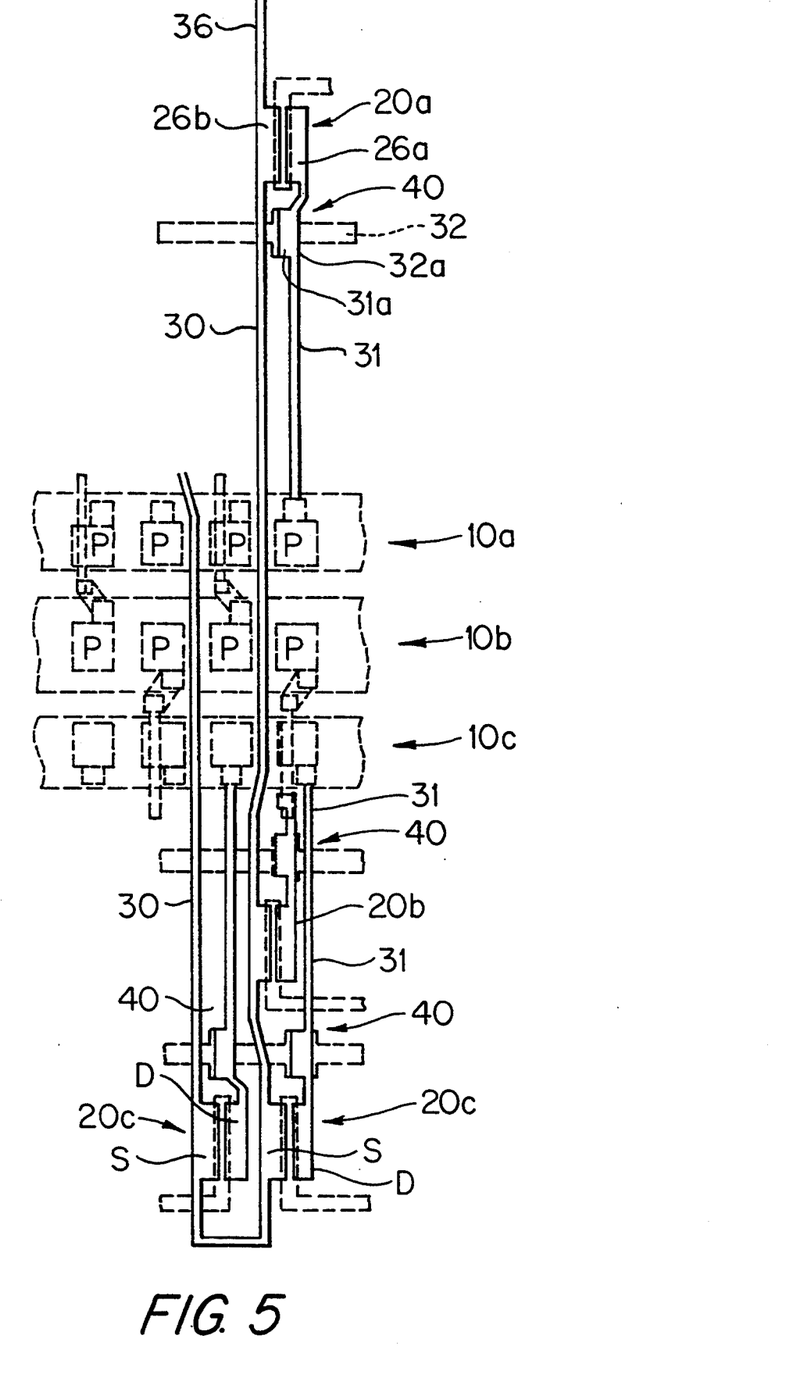
FIG. 5 is a partial plan view illustrative of a color image reading apparatus according to a second embodiment of the present invention.

FIG. 5 shows a second embodiment of the present invention. This variation is a color image reading apparatus of a type having a meander wiring layout for the connections of the photosensors P to constitute photosensor arrays 10.

As will be seen, meander wiring conductors 36 are laid between neighboring blocks to allow electrical contact to be made to two signal output lines 30 which respectively belong to the neighboring blocks. Other than that, parts configurations in FIG. 5 are identical to those of the first embodiment which have been described with reference to FIG. 1. Therefore, identical parts are designated by the same reference numerals or characters, and their detailed descriptions are omitted.

Figure 6:
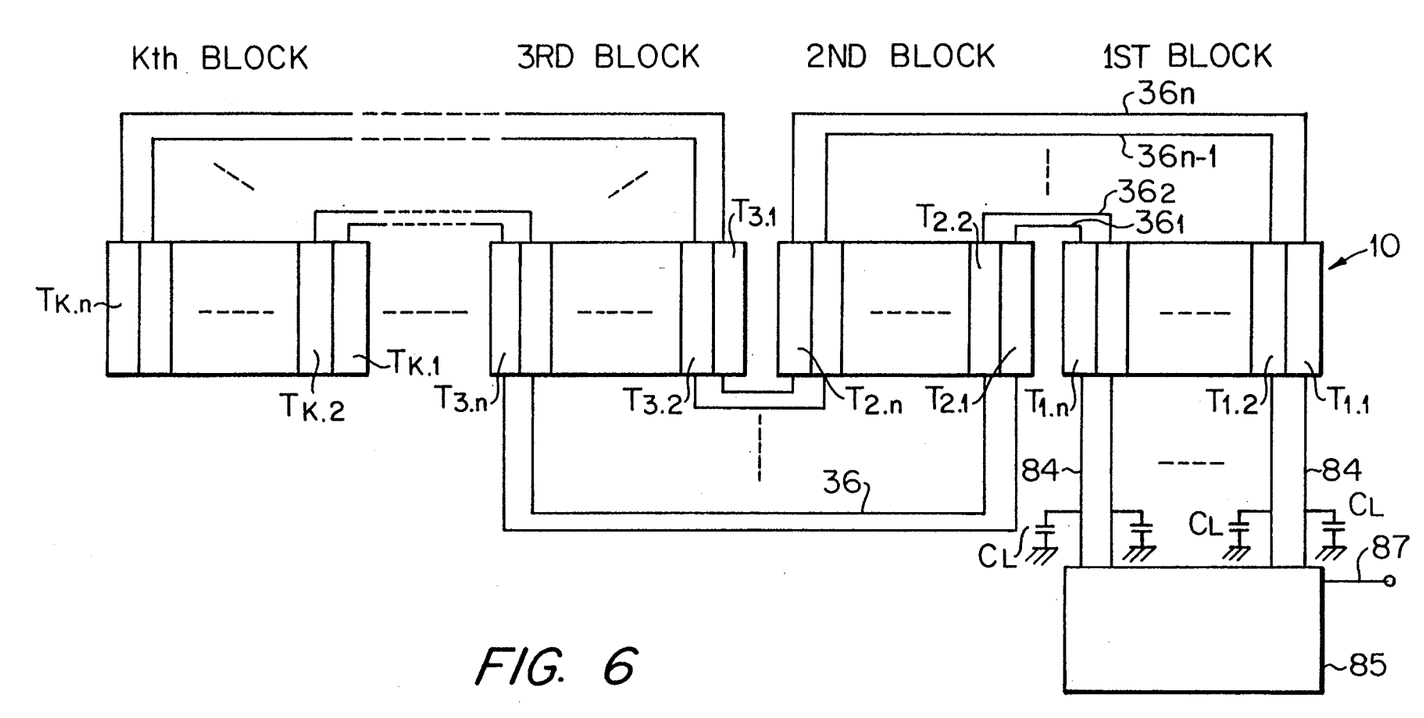
FIG. 6 is a wiring diagram of the color image reading apparatus shown in FIG. 5.

The meander wiring layout will be specifically explained with reference to FIG. 6, which shows a wiring diagram of an image reading apparatus having a single photosensor array. Source electrodes S of TFT T1,1 to T1,n coupled to respective photosensors P in the first block are connected to source electrode of TFT T2,1 to T2,n in the second block by meander wiring conductors 36. Counterparts to be connected are determined in such a manner that starting with T1,n in the first block, the most adjacent TFT in the second block is connected. The meander wiring conductors 36 are arranged in order of wiring length such that shorter meander wiring conductor can be placed closer to photosensor array 10. Taking relations between the first block and the second block as an example, the shortest meander wiring conductor $36_1$ is laid closest to photosensor array 10, the second shortest meander wiring conductor $36_2$ is laid second closest to photosensor array 10, and so forth, and finally the longest meander wiring conductor is laid most outside.

In like fashion, TFT T2,1 to T2,n in the second block are connected to TFT T3,1 to T3,n in the third block by meander wiring conductors 36. Pairs of groups of meander wiring conductors 36 adjacent in the fast direction are located in opposite sides of photosensor array 10. The meandering conductor groups are distributed alternately above or below just like drawing meander lines in the fast scan direction, so that meander wiring conductors 36 cannot be overlapped with one another.

Further, one end of each of the signal output lines 84 is connected to the source electrode of a TFT 20 in the first block, and the other end is connected to driver IC 85. By activating TFTs in a given block, electric charges in photosensors P in the given block are transferred to associated line capacitances CL of signal output lines 84. Electric charges transferred from odd numbered blocks are sequentially read out in driver IC 85 in order from photosensor Pk,1 to photosensor Pk,n, that is, from right to left. In contrast with this, electrical charges transferred from even numbered blocks are read out in order from photosensor Pk,n to photosensor Pk,1, that is, from left to right, which causes electric signals of a wrong order. So as to reverse the order of such electrical signals read out from left to right, it may be necessary for an external storage circuitry to be provided to store such electrical signals temporarily.

According to the aforementioned second embodiment, the meander wiring conductors 36 replace the matrix configuration multilayered wiring 83 shown in FIG. 8, which allows the elimination of intersecting signal lines pertaining to the multilayered wiring layout. In consequence, crosstalk does not occur between signal lines and more accurate image signals are possible.

One advantage of the present invention is that the photosensor arrays are disposed immediately adjacent to one another so that it is possible to make the reading points of the respective photosensor arrays closer to one another, resulting in decrease of capacity of line memory means necessary for producing regenerated image signals.

Another advantage is that the photosensor arrays are placed immediately adjacent to one another so that the intensity of light incident upon the photosensor arrays does not vary so much depending on array positions if a lens system such as Selfoc lens is employed to concentrate light reflected from an original onto the photosensor arrays. This allows image signals to be more accurately representative of the image of a scanned original.

The present invention has been described above with respect to a particular embodiment, but the scope of the invention is not limited to this, but is defined by the accompanying claims. Various other embodiments within the scope of the present invention will be clear to those skilled in the relevant art. In particular, the embodiment describes the case in which there are exactly three arrays of photosensors, but the invention may equally be applied in cases in which there are four or more arrays, in which case the two or more intermediate arrays will be treated in a manner corresponding to the treatment of the single center array described in the embodiment.

What is claimed is:

1. A color image reading apparatus comprising:
    a photosensing assemblage having at least three arrays of photosensors aligned in a fast scan direction, said arrays arranged substantially parallel to one another and separated in a slow scan direction, there being thus two outer-positioned arrays and at least one intermediate array;
    switching elements connected one to each of said photosensors to transfer electric charges generated in each of said photosensors, said switching elements aligned on opposite sides of said photosensing assemblage; and
    wiring conductors connecting said photosensors with said switching elements, at least one of said wiring conductors connecting photosensors included in said intermediate array with associated switching elements and passing across said outer-positioned arrays, substantially so that pairs of said wiring conductors adjacent in the fast scan direction are disposed in opposite directions in the slow scan direction, and at least one of said wiring conductors connecting said photosensors in said intermediate array with said associated switching elements is overlapped in the thickness direction with a photosensor in another array.

2. A color image reading apparatus of claim 1 further comprising a capacitance means provided between said photosensor and said switching element to store electric signals generated in said photosensor.

3. A color image reading apparatus of claim 2, in which said wiring conductor is a constituent element of said capacitance means.

4. A color image reading apparatus of claim 1, in which said switching element comprises a thin film transistor having a source electrode, a drain electrode, and a gate electrode, and said wiring conductor is connected to said drain electrode of said thin film transistor.

* * * * *